United States Patent [19]
Wu

[11] Patent Number: 5,973,350
[45] Date of Patent: Oct. 26, 1999

[54] STACKED CAPACITOR STRUCTURE FOR HIGH DENSITY DRAM CELLS

[75] Inventor: Shye-Lin Wu, Hsinchu, Taiwan

[73] Assignee: Texas Instruments - Acer Incorporated, Hsinchu, Taiwan

[21] Appl. No.: 09/060,565

[22] Filed: Apr. 14, 1998

[51] Int. Cl.⁶ .................................................. H01L 27/108
[52] U.S. Cl. ........................................ 257/308; 257/306
[58] Field of Search .................................. 257/306, 307, 257/308, 309; 438/253, 396, 397

[56] References Cited

U.S. PATENT DOCUMENTS

| | | | |
|---|---|---|---|
| 4,742,018 | 5/1988 | Kimura et al. | 438/253 |
| 5,103,275 | 4/1992 | Miura et al. | 257/306 |
| 5,208,180 | 5/1993 | Gonzalez | 438/396 |
| 5,284,787 | 2/1994 | Ahn | 438/396 |
| 5,478,769 | 12/1995 | Lim | 438/396 |
| 5,478,770 | 12/1995 | Kim | 438/396 |
| 5,595,929 | 1/1997 | Tseng | 438/397 |
| 5,641,702 | 6/1997 | Imai et al. | 438/396 |
| 5,652,168 | 7/1997 | Komori et al. | 438/396 |

FOREIGN PATENT DOCUMENTS 2260645   4/1993   United Kingdom ................... 438/212

Primary Examiner—Sara Crane
Attorney, Agent, or Firm—Harness, Dickey & Pierce, P.L.C.

[57] ABSTRACT

A structure of a capacitor on a semiconductor wafer including the following structure is disclosed herein. A first electrode is formed on the semiconductor wafer. The first electrode includes a flower structure. The first electrode is formed on the semiconductor wafer. The first electrode includes a flower structure. The first electrode includes a flower neck portion, a flower bottom portion, and a flower top portion. The flower neck portion is electrically coupled to the semiconductor wafer. The flower bottom portion is electrically coupled to the flower neck portion, in which the flower bottom portion includes a first protudent portion. The flower top portion includes a downward hemispherical portion and a second protrude portion. The flower top portion is electrically coupled to the flower neck portion. A first dielectric film formed on the first electrode, and the first dielectric layer is the dielectric layer of the capacitor. A second electrode is formed on the first dielectric film.

18 Claims, 4 Drawing Sheets

STACKED CAPACITOR STRUCTURE FOR HIGH DENSITY DRAM CELLS

FIELD OF THE INVENTION

The present invention relates to the structure of a semiconductor capacitor in a DRAM cell, and particularly relates to a stacked flower capacitor structure with a large capacitance.

BACKGROUND OF THE INVENTION

Dynamic Random Access Memory (DRAM) devices have been applied in the integrated circuits for many years. A DRAM cell is in general a semiconductor memory device with one transistor and one capacitor, in which data of 1-bit can be stored by the charge stored therein. Indeed, a memory cell is provided for each bit stored by a DRAM device. Each memory cell typically consists of a storage capacitor and an access transistor. The source of the access transistor is connected to one terminal of the capacitor. The transistor drain electrode and the gate electrode are connected to external connection lines called a bit line and a word line, respectively. The other terminal of the capacitor is connected to a reference voltage. Therefore, the formation of a DRAM memory cell comprises the formation of a transistor, a capacitor and contacts to the external circuits.

As a tendency to the higher density of an integrated semiconductor device, it causes the density of the DRAM cells to be increased, and the area occupied by one memory cell becomes gradually decreased. Due to the trend of making the semiconductor devices, the sizes of the memory cells have gotten smaller and smaller. Thus, the area available for a single memory cell has become very small. This has caused a reduction in the area occupied by the capacitor, and has resulted in a reduction of the capacitance of a cell. For the very small memory cells, planar capacitor has become very difficult for use reliably. Specifically, as the size of the capacitor is decreased, the capacitance of the capacitor is also decreased and the amount of the charge capable of being stored by the capacitor is similarly decreased. Therefore, the present invention is devoted to the manufacture of a capacitor with a maximum capacity in a limited area.

Prior art with the approach to overcome these problems, has resulted in the development of the various types of capacitors. One of the capacitors has the bathtub-shaped structure. The process is operated with the characteristic that the staked capacitor has more capacitance than that of the planar type capacitor. In order to increase the capacitance of the capacitor, the thickness of the dielectric film of the capacitor is reduced, and the area of the electrodes of the capacitor is increased by overcoming the limitation of the lithography technique. In other words, the area of the electrodes in one memory cell is increased without the problem of step coverage. Please see "Method For Fabricating Staked Capacitors In A DRAM Cell, Jin-Suk Choi. et al., U.S. Pat. No. 5,104,281". Yet, the shape of the storage node of the memory cell is like a bathtub, and the height of the electrode is not extended, so that the area of the electrodes is not largely increased.

Further, a capacitor over bit line (COB) cell with a hemispherical grain silicon storage node has been developed (see "Capacitor Over Bit Line Cell With Hemispherical Grain Storage Node For 64 Mb DRAMs", M. Sakao et al., microelectronics research laboratories, NEC Corporation, IEDM Tech Dig., December 1990, pp655–658). The HSG-silicon is deposited by low pressure chemical vapor deposition method at the transition temperature from amorphous silicon to polycrystalline silicon. This memory cell provides high capacitance by increasing the effective surface area of a simple storage node. The present invention increases the effective area of the electrodes of the capacitor without the usage of the HSG-silicon; thus the process is simplified.

SUMMARY OF THE INVENTION

The foregoing disadvantages of the traditional structure of a capacitor for a DRAM can be overcome by a new structure that is disclosed herein. A structure of a capacitor on a semiconductor wafer includes the following structure: a first electrode, a first dielectric film, and a second electrode.

The first electrode is formed on the semiconductor wafer. The first electrode includes a flower structure. The first electrode includes a flower neck portion, a flower bottom portion, and a flower top portion. The flower neck portion is electrically coupled to the semiconductor wafer, and the flower bottom portion is electrically coupled to the flower neck portion. The flower bottom portion includes a first protudent portion, which overlapping the word line and a gate electrode of the transfer transistor of the semiconductor wafer. The flower top portion includes a downward hemispherical portion and a second protrude portion. The flower top portion is electrically coupled to the flower neck portion, and the flower top portion is electrically coupled to the flower neck portion by the downward hemispherical portion.

The aforementioned first electrode is electrically coupled to the semiconductor wafer. The first dielectric film is formed on the first electrode, and the first dielectric layer is the dielectric layer of the capacitor. The second electrode is formed on the first dielectric film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A stacked capacitor structure of a capacitor used in a DRAM cell is disclosed herein. To increase the effective area of the electrodes of the storage capacitor, the present invention provides a new stacked capacitor structure of high capacitance without delicate or complex process. The memory cell includes a transfer transistor and a capacitor, and is provided for each bit stored by a DRAM cell. Either the source or drain of the transfer transistor is connected to one terminal of the capacitor. The other side of the transistor and the transistor gate electrode are connected to the external connection lines called a bit line and a word line respectively. The other terminal of the capacitor is connected to a reference voltage.

A structure of a capacitor on a semiconductor wafer includes the following basic structure such as a first electrode, a first dielectric film, and a second electrode. A plurality of charge stored in the capacitor are controlled by a word line and a transfer transistor of the semiconductor wafer. The first electrode is formed on the semiconductor wafer. The first electrode includes a flower structure. The flower structure has a flower neck portion, a flower bottom portion, and a flower top portion. The flower structure is formed of poly silicon, which is the electrode of the capacitor on the semiconductor wafer.

The flower neck portion contains a cylinder of poly silicon, and the cylinder is electrically coupled to the semiconductor wafer. The flower bottom portion is electrically coupled to the flower neck portion. In addition, the flower bottom portion has a first protudent portion. The first protrude portion overlaps the word line and the gate electrode of the transfer transistor of the semiconductor wafer. The flower top portion includes a second protrude portion and a downward hemispherical portion which is electrically coupled to the flower neck portion by the poly silicon cylinder. The second protrude portion extends horizontally from the downward hemispherical portion. The flower top portion is electrically coupled to the flower neck portion by the downward hemispherical portion.

The afforementioned first electrode is electrically coupled to the semiconductor wafer. The first dielectric film is formed on the surface of the first electrode, and the first dielectric layer is the dielectric layer of the capacitor on the semiconductor wafer. The second electrode is formed on the first dielectric film. In addition, the first dielectric film can be formed of the material selected from the group consisting of ONO, $Ta_2O_5$, PZT and BST. Besides, the second electrode is formed of the polysilicon.

Figure 1:
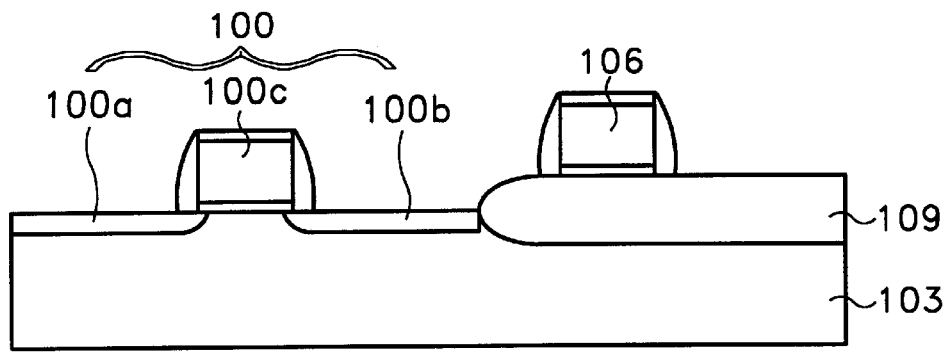
FIG. 1 is a cross sectional view of a semiconductor wafer illustrating the transfer transistor and a word line on the field oxide, the transfer transistor includes drain electrode, gate electrode and the source electrode.
Figure 2:
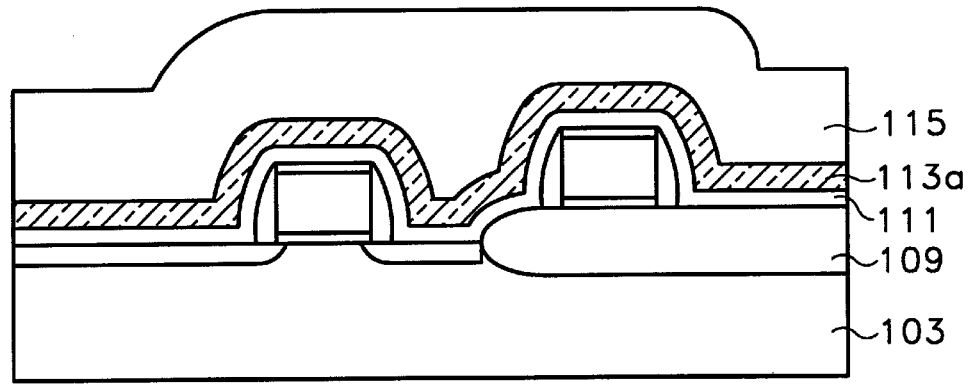
FIG. 2 is a cross sectional view of a semiconductor wafer illustrating the steps of sequentially forming a silicon nitride layer, a doped poly-silicon layer and a borophosphosilicate glass (BPSG) layer on the first poly-silicon layer.

The capacitor mentioned above can be formed on the wafer by the following method. In which, the cross sectional view of the wafer with a transfer transistor and a word line on the substrate is shown in FIG. 1. The drain electrode 100a and the source electrode 100b, which are formed in the substrate 103, combined with the gate electrode 100c becomes the transfer transistor 100. The word line 106 is formed on the field oxide 109. Turning next to FIG. 2, a first dielectric layer 111 is formed on the topography of the wafer. Next, form a first conductive layer 113a is formed on the first dielectric layer 111 followed by forming a second dielectric layer 115 on the first conductive layer. The first dielectric layer 111 is made of a suitable materiel preventing etching through the first dielectric layer 111 when etching the first conductive layer 113a. The first dielectric layer 111 can be preferably formed of silicon nitride ($Si_3N_4$), and the first conductive layer 113a is preferably formed of Chemical Vapor Deposition (CVD) doped poly-silicon. The second dielectric layer 115 is preferably formed of borophosphosilicate glass (BPSG) or TEOS-oxide. The thickness of the second dielectric layer is preferably about 500–2000 angstroms.

Figure 3:
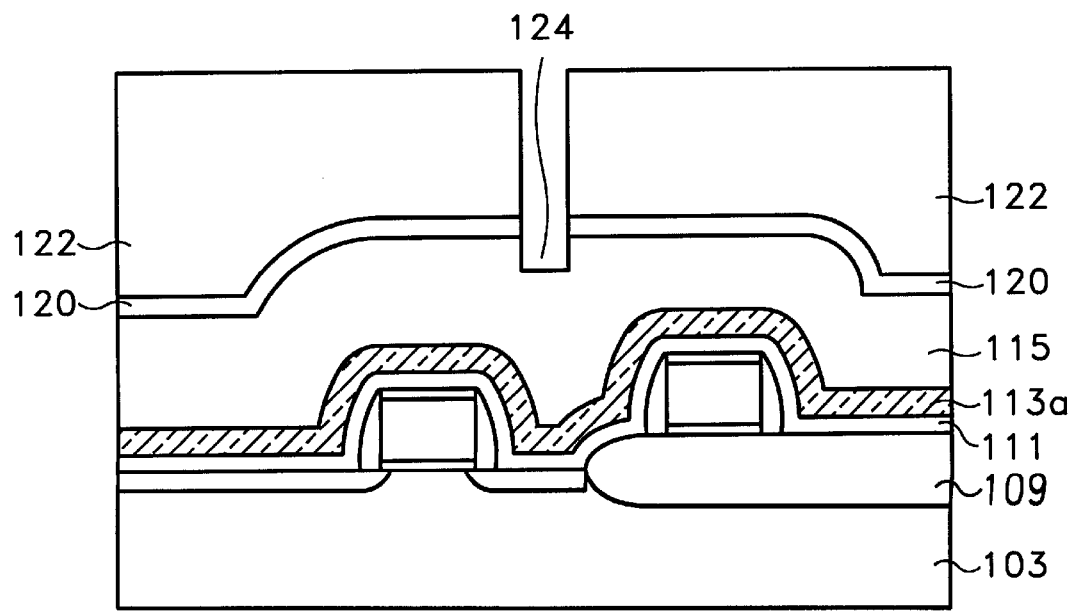
FIG. 3 is a cross sectional view of a semiconductor wafer illustrating the steps of forming an undoped poly-silicon layer, and then etching the undoped poly-silicon layer and a portion of the BPSG layer.
Figure 4:
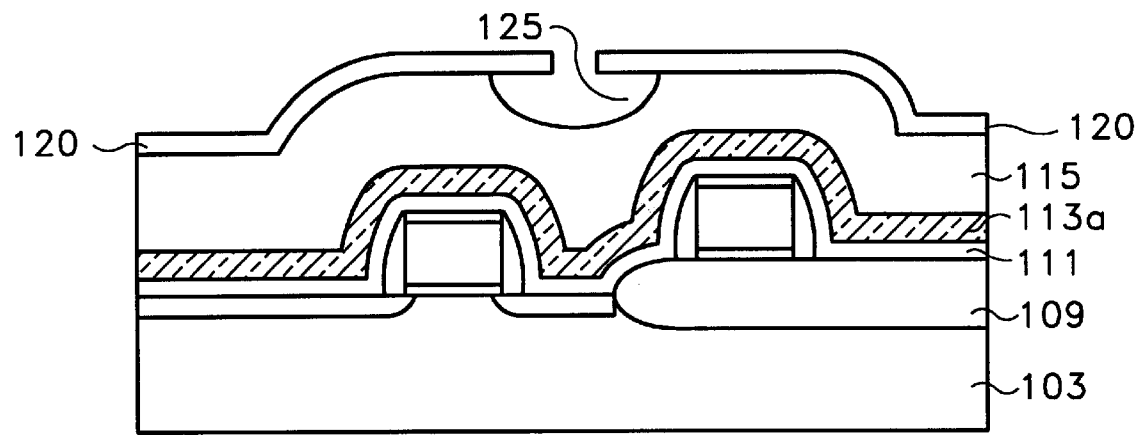
FIG. 4 is a cross sectional view of a semiconductor wafer illustrating the steps of isotropically etching the etched portion of the BPSG layer.

Turing to FIG. 3, a third dielectric layer 120 is formed on the second dielectric layer 115, and then a photoresist layer 122 is spinned on the third dielectric layer 120. The third dielectric layer is formed of a suitable material that can act as a hard mask in the following etching steps. The preferable material that forms the third dielectric layer 120 in this preferred embodiment is undoped poly-silicon. Being processed by lithography and etching steps, a first hole 124 is formed in the photoresist layer 122, third dielectric layer 120 and a portion of the second dielectric layer 115. The thickness of the third dielectric layer is preferably about 300–3000 angstroms. Subsequently, an isotropic etching is performed that the second dielectric layer is further etched, and the structure is shown in FIG. 4. A hemispherical cavity 125 is thus formed in the second dielectric layer, and the third dielectric layer is not etched in this etching process. The etching process is preferably a wet etching process that uses the diluted HF or BOE solution as an etchant.

Figure 5:
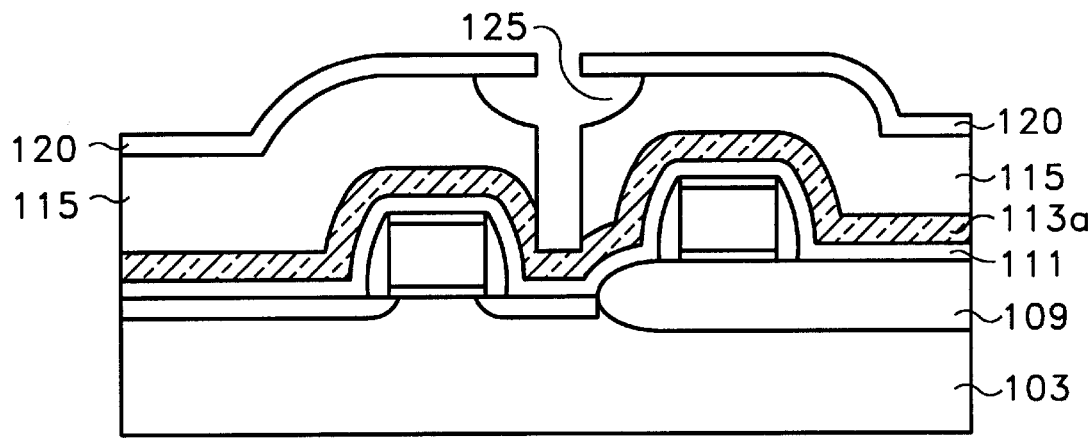
FIG. 5 is a cross sectional view of a semiconductor wafer illustrating the step of etching the BPSG layer using the etched undoped poly-silicon as a mask, the etching stop at the surface of the doped poly-silicon.
Figure 6:
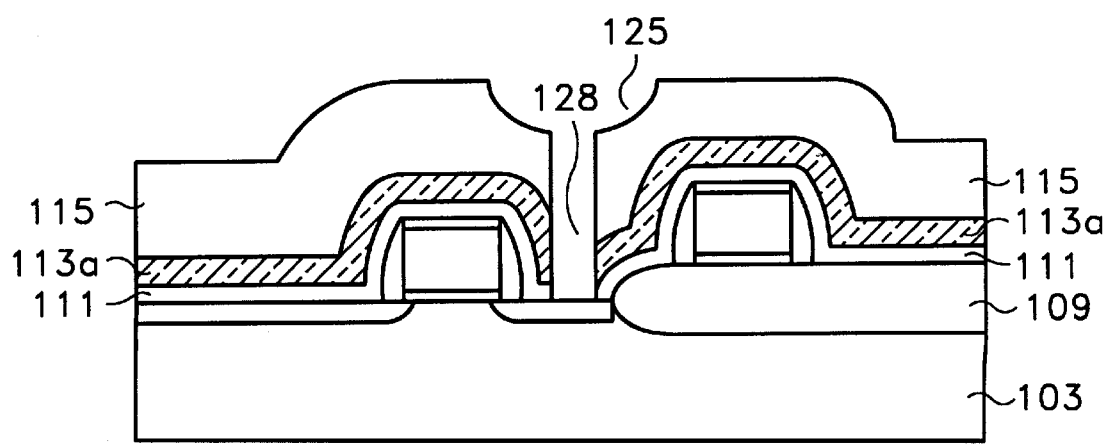
FIG. 6 is a cross sectional view of a semiconductor wafer illustrating the step of etching the doped poly-silicon layer and the undoped poly-silicon at a time, followed by a step of etching the silicon nitride layer.

Referring next to FIG. 5, an anisotropic etching is used to etch through the second dielectric layer 115 and stop at the first conductive layer 113a. The etchant has the etching selectivity between oxide and poly-silicon about 100 to 1, and the etchant is preferably an anisotropic etching by using $CHF_3$, $C_2F_6$, or $C_3F_8$ as an etchant. Next, turning to FIG. 6, the first conductive layer 113a is removed together with the third dielectric layer 120 in a dry etching. The dry etching uses an etchant such as $CClF_3+Cl_2$, $CHCl_3+Cl_2$ or $SF_6$. After the aforementioned process, the next step is to etch the first dielectric layer 111 to form a second hole 128 at the bottom of the hemispherical cavity 125, and stretch to the surface of the source electrode 100b in the substrate 103. The first conductive layer 113a is used to perform the self-aligned contact.

Figure 7:
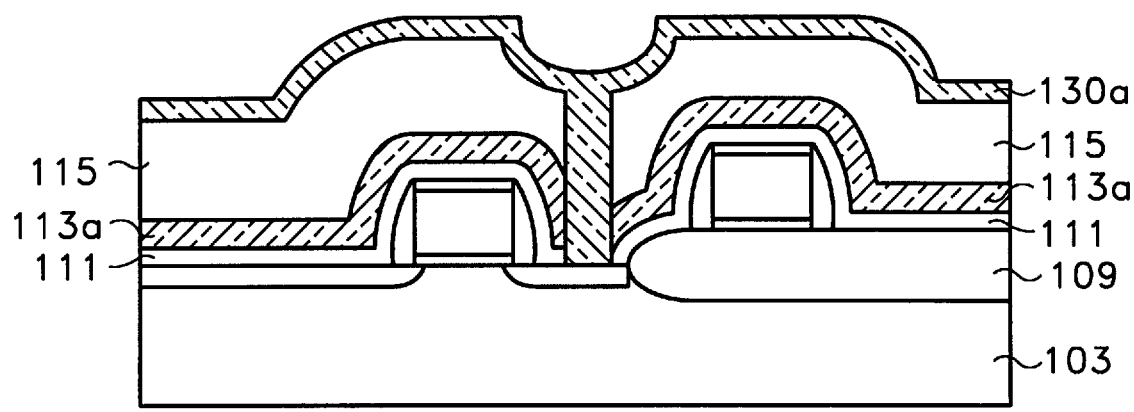
FIG. 7 is a cross sectional view of a semiconductor wafer illustrating the step of forming a doped poly-silicon layer.
Figure 8:
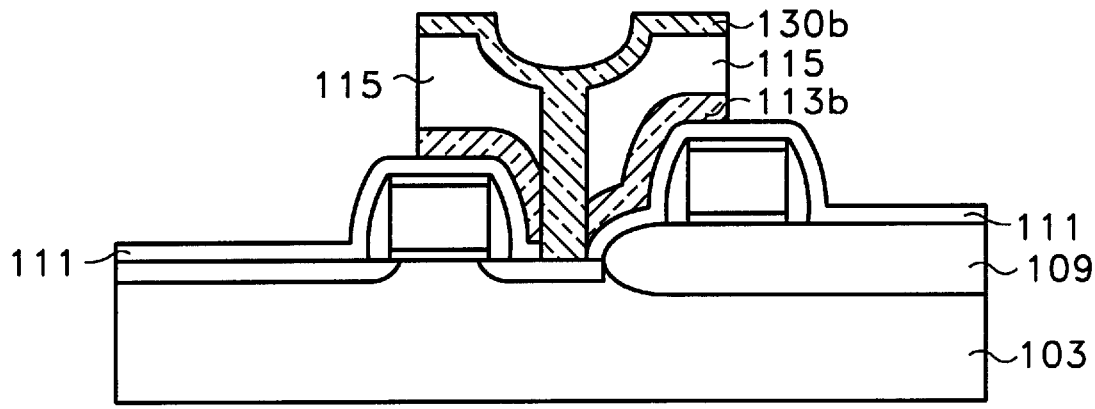
FIG. 8 is a cross sectional view of a semiconductor wafer illustrating the step of defining the storage node of the capacitor.
Figure 9:
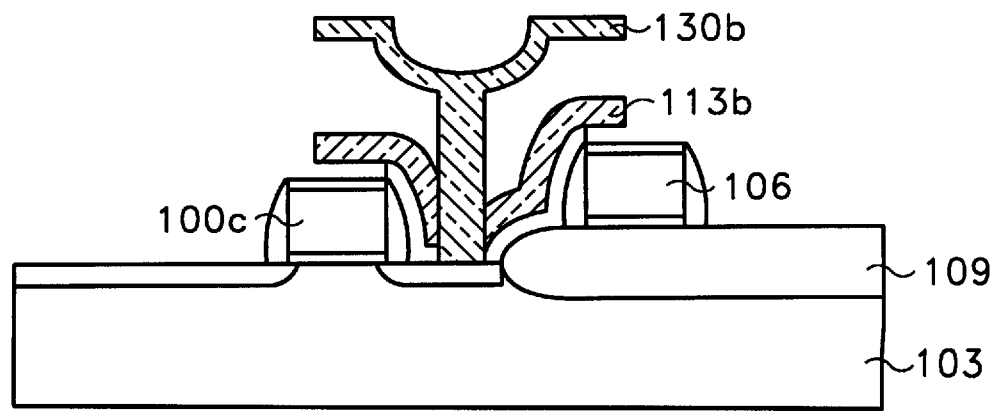
FIG. 9 is a cross sectional view of a semiconductor wafer illustrating the step of removing the residual BPSG in the storage node and then etching the exposed silicon nitride layer, so that the underlying electrode of the capacitor formed thereby.

Next, a second conductive layer 130a is formed in the second hole 128 and on the surface of the second dielectric layer 115 as well as the hemispherical cavity 125. Referring to FIG. 7, the second conductive layer 130a is preferably formed of doped poly-silicon in this preferred embodiment. The doped poly-silicon is doped with conductive impurity. To define the storage node of the capacitor of the memory cell, the lithography and etching is utilized, and the bottom electrode of the capacitor is formed. The etching process defining the storage node stops at the surface of the first dielectric layer 111. As shown in FIG. 8, the storage node is defined and the truncated first conductive layer 113b together with the truncated second conductive layer 130b form the bottom electrode of the capacitor. The portions of the first dielectric layer that is not covered by the truncated first conductive layer 113b, then the portion of the second dielectric layer 115 between the truncated first conductive layer 113b and the truncated second conductive layer 130b are removed in the next step. The result is shown in FIG. 9, in which the first dielectric layer is removed. The gap between the truncated first dielectric layer 113b and the gate electrode 100c as well as the word line 106 can increase the effective area of the electrode of the capacitor. The etchant used to remove the first dielectric layer in this preferred embodiment is $CF_4/O_2$, $CF_4/H_2$ or $CHF_3$.

Figure 10:
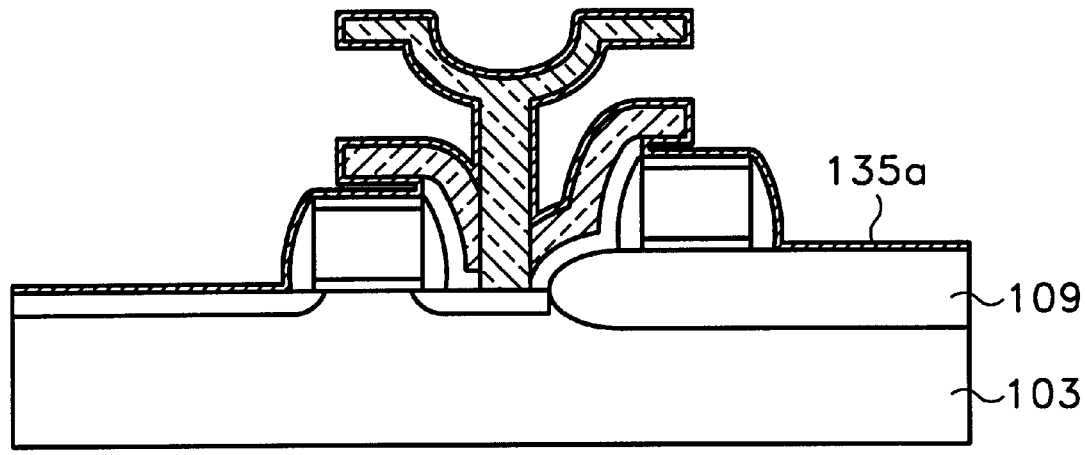
FIG. 10 is a cross sectional view of a semiconductor wafer illustrating the step of forming a fourth dielectric layer, thus the dielectric film of the capacitor is formed thereby.
Figure 11:
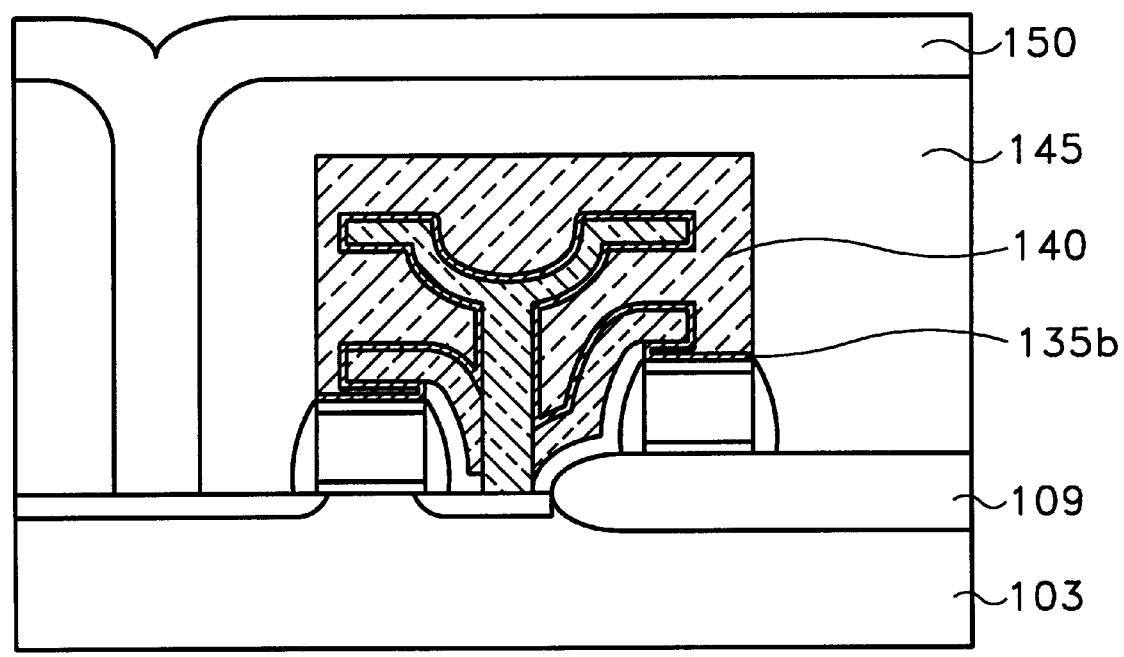
FIG. 11 is a cross sectional view of a semiconductor wafer illustrating the steps of forming a doped poly-silicon layer, and then defining the cell plate and a step of forming the bit line.

Next, the dielectric layer is formed on the surface of the bottom electrode of the capacitor. Referring to FIG. 10, the fourth dielectric layer 135 is formed on the topography of the wafer. The fourth dielectric layer 135a is preferably formed of ONO, $Ta_2O_5$, PZT and BST. Having been processed by lithography, etching, and then the deposition of the third conductive layer, the cell plate is thus formed. Referring next to FIG. 11, the fourth dielectric layer 135a is truncated to fit the size of the cell plate and the truncated fourth dielectric layer 135b is the dielectric film of the capacitor. Forming a third conductive layer 140 on the surface of the truncated fourth dielectric layer 135b, the top electrode of the capacitor is then formed as the cell plate. The fifth dielectric layer 145 is deposited on the topography of the wafer and the bit line 150 is formed to finish the memory cell.

As will be understood by persons skilled in the art, the foregoing preferred embodiment of the present invention is illustrative of the present invention rather than limiting the present invention. Having described the invention in connection with a preferred embodiment, for example, if the various etchant is used in the preferred embodiment, as long as the structure of the capacitor is the same as that disclosed herein, the modification will now suggest itself to those skilled in the art. While the preferred embodiment of the invention has been illustrated and described, it will be appreciated that various changes can be made therein without departing from the spirit and scope of the invention.

What is claimed is:

1. A stacked capacitor structure of a capacitor on a semiconductor wafer, a plurality of charge being controlled by a word line and a transfer transistor of the semiconductor wafer, said structure comprising:
    a first electrode formed on the semiconductor wafer, said first electrode being electrically coupled to the semiconductor wafer, said first electrode comprising:
        a flower neck portion electrically coupling the semiconductor wafer;
        a flower bottom portion electrically coupled to said flower neck portion, said flower bottom portion comprising a first protrudent portion; and
        a flower top portion comprising a downward hemispherical portion and a second protrudent portion, said flower top portion being electrically coupled to said flower neck portion, said downward hemispherical portion comprising a first hemispherical surface and a second hemispherical surface;
    a first dielectric film formed on said first electrode, said first dielectric film being a dielectric layer of said capacitor, said first hemispherical surface and said second hemispherical surface contacting said first dielectric film, an underside surface of said first protrudent portion facing said word line and said transfer transistor being covered with said first dielectric film; and
    a second electrode formed on said first dielectric film, wherein said second electrode covers surface of said first dielectric film enclosing said underside surface of said first protrudent portion facing said word line and said transfer transistor.

2. The structure as claim 1, wherein said first protrude portion overlaps said word line and a gate electrode of said transfer transistor of said semiconductor wafer.

3. The structure as claim 1, wherein said flower top portion being electrically coupled to said flower neck portion by said downward hemispherical portion.

4. The structure as claim 1, wherein said second protrude portion extends horizontally from said downward hemispherical portion.

5. The structure as claim 1, wherein said first electrode being formed of poly silicon.

6. The structure as claim 1, wherein said first dielectric film is selected from the group consisting of ONO, $Ta_2O_5$, PZT and BST.

7. The structure as claim 1, wherein said second electrode is formed of doped poly-silicon that doped with conductive impurities.

8. A stacked capacitor structure of a capacitor on a semiconductor wafer, a plurality of charge being controlled by a word line and a transfer transistor of the semiconductor wafer, said structure comprising:
    a first electrode formed on the semiconductor wafer, said first electrode being electrically coupled to the semiconductor wafer, said first electrode comprising:
        a flower neck portion electrically coupling the semiconductor wafer;
        a flower bottom portion electrically coupled to said flower neck portion, said flower bottom portion comprising a first protrudent portion, said first protrudent portion overlapping said word line and a gate electrode of said transfer transistor of the semiconductor wafer; and
        a flower top portion comprising a downward hemispherical portion and a second protrudent portion, said flower top portion being electrically coupled to said flower neck portion, said downward hemispherical portion comprising a first hemispherical surface and a second hemispherical surface;
    a first dielectric film formed on said first electrode, said first dielectric film being a dielectric layer of said capacitor, said hemispherical surface and said second hemispherical surface contacting said first dielectric film, a surface of said first protrudent portion facing said word line and said transfer transistor being covered with said first dielectric film; and
    a second electrode formed on said first dielectric film, wherein said second electrode covers surface of said first dielectric film enclosing said underside surface of said first protrudent portion facing said word line and said transfer transistor.

9. The structure as claim 8, wherein said flower top portion being electrically coupled to said flower neck portion by said downward hemispherical portion.

10. The structure as claim 8, wherein said second protrude portion extends horizontally from said downward hemispherical portion.

11. The structure as claim 8, wherein said first electrode being formed of poly silicon.

12. The structure as claim 8, wherein said first dielectric film is selected from the group consisting of ONO, $Ta_2O_5$, PZT and BST.

13. The structure as claim 8, wherein said second electrode is formed of doped poly-silicon that doped with conductive impurities.

14. A structure of a capacitor on a semiconductor wafer, a plurality of charge being controlled by a word line and a transfer transistor of the semiconductor wafer, said structure comprising:
   a first electrode formed on the semiconductor wafer, said first electrode being electrically coupled to the semiconductor wafer, said first electrode comprising:
      a flower neck portion electrically coupling the semiconductor wafer;
      a flower bottom portion electrically coupling to said flower neck portion, said flower bottom portion comprising a first protrudent portion, said first protrudent portion overlapping said word line and a gate electrode of said transfer transistor of the semiconductor wafer; and
      a flower top portion comprising a downward hemispherical portion and a second protrudent portion, said flower top portion being electrically coupled to said flower neck portion, said flower top portion being electrically coupled to said flower neck portion by said downward hemispherical portion, said downward hemispherical portion comprising a first hemispherical surface and a second hemispherical surface;
   a first dielectric film formed on said first electrode, said first dielectric film being a dielectric layer of said capacitor, said first hemispherical surface and said second hemispherical surface contacting said first dielectric film, a surface of said first protrudent portion facing said word line and said transfer transistor being covered with said first dielectric film; and
   a second electrode being formed on said first dielectric film, wherein said second electrode covers surface of said first dielectric film enclosing said underside surface of said first protrudent portion facing said word line and said transfer transistor.

15. The structure as claim 14, wherein said second protrude portion extends horizontally from said downward hemispherical portion.

16. The structure as claim 14, wherein said first electrode being formed of poly silicon.

17. The structure as claim 14, wherein said first dielectric film is selected from the group consisting of ONO, $Ta_2O_5$, PZT and BST.

18. The structure as claim 14, wherein said second electrode is formed of doped poly-silicon that doped with conductive impurities.

* * * * *